United States Patent [19]
Kiyota et al.

[11] Patent Number: 5,387,545
[45] Date of Patent: Feb. 7, 1995

[54] IMPURITY DIFFUSION METHOD

[75] Inventors: Yukihiro Kiyota, Kodaira; Tohru Nakamura, Mitaka; Takahiro Onai, Ome; Taroh Inada, Tokyo, all of Japan

[73] Assignee: Hitachi, Ltd., Tokyo, Japan

[21] Appl. No.: 805,969

[22] Filed: Dec. 12, 1991

[30] Foreign Application Priority Data

Dec. 20, 1990 [JP] Japan ................................. 2-404153

[51] Int. Cl.⁶ .......................................... H01L 21/223
[52] U.S. Cl. ................... 437/165; 437/166; 437/946; 437/950; 148/DIG. 17
[58] Field of Search ............... 437/165, 166, 946, 950; 148/DIG. 30, DIG. 37, DIG. 38, DIG. 17

[56] References Cited

U.S. PATENT DOCUMENTS

| | | | |
|---|---|---|---|
| 3,681,154 | 8/1972 | Ashton et al. | 437/165 |
| 3,716,404 | 2/1973 | Hirao et al. | 437/165 |
| 4,939,103 | 7/1990 | Szolgyemy | 437/165 |
| 5,089,441 | 2/1992 | Moslehe | 437/225 |

FOREIGN PATENT DOCUMENTS

| | | |
|---|---|---|
| 1521303 | 11/1972 | Germany . |
| 47-12417 | 4/1972 | Japan . |
| 52-4781 | 1/1977 | Japan . |
| 5944772 | 3/1980 | Japan . |
| 55-096630 | 7/1980 | Japan . |
| 58-207641 | 12/1983 | Japan . |

OTHER PUBLICATIONS

Mecs, B., "POCL₃ Liquid Diffusion Process" vol. 9, No. 10, Mar. 1967 pp. 1418–1419.
Ghandi, S., *VLSI Fabrication Principles: Silicon & Gallium Arsenide* John Wiley & Sons, Jan. 6, 1993, p. 477.
Nishizawa, J., et al, "Ultrashallow, High Doping of Boron Using Molecular Layer Doping", Appl. Phys. Letters, vol. 56, No. 14, Apr. 1990, pp. 1334–1335.
Wolf, S., *Silicon Processing for the VLSI ERA;* vol. 2, Lattice Press, 1990 pp. 491–495.
Wolf, S. et al, *Silicon Processing for the VLSI Era;* vol. 1, Lattice Press, 1986, pp. 264–265.

*Primary Examiner*—George Fourson
*Attorney, Agent, or Firm*—Antonelli, Terry, Stout & Kraus

[57] ABSTRACT

An impurity diffusion method which can control a surface atomic concentration from a low to a high surface atomic concentration with a good uniformity is provided. Natural oxide is removed from the surface of a semiconductor substrate with a deoxidizing atmosphere gas as a diffusion atmosphere gas in advance, and then an impurity gas is passed thereto, while passing the deoxidizing atmosphere gas thereto, thereby conducting the diffusion. Flow rate or concentration of impurity of the impurity gas is so set that the impurity atomic concentration of the diffusion layer can be controlled by the flow rate or the concentration of impurity of the impurity gas. The impurity atomic concentration of the diffusion layer can be controlled by adjusting the flow rate or concentration of impurity of the impurity gas, and a diffusion layer having a low impurity atomic concentration can be formed. A shallow junction having a depth of not more than 50 nm can be formed.

16 Claims, 7 Drawing Sheets

Ω·cm

IMPURITY DIFFUSION METHOD

BACKGROUND OF THE INVENTION

FIELD OF THE INVENTION

This invention relates to an impurity diffusion method and an apparatus for carrying out the impurity diffusion method, and more particularly to an impurity diffusion method capable of forming shallow junctions with high controllability and an apparatus for carrying out the impurity diffusion method.

DESCRIPTION OF THE PRIOR ART

Conventional impurity diffusion method applicable to semiconductor substrates is discussed in ordinary textbooks such as A. S. Grove: Physics and Technology of Semiconductor Devices, published by John Wiley & Co., or H. Yanai and M. Nagata: Integrated Electronics (1), pp 97–119, published by Corona Publishing Co., Ltd. in Japanese. The conventional impurity diffusion method is carried out through a step of making shallow diffusion of impurity into the surface region of a semiconductor substrate in advance (predeposition step) and a step of deep diffusion of the impurity into the interior of the semiconductor substrate (drive-in step). In case of formation of a shallow junction, particularly the drive-in step is not carried out.

The predeposition step can be carried out by any of following two procedures. That is, according to a first aspect of the first procedure, the surface of a semiconductor substrate is made bare and then is brought into contact with impurity atoms. Usually, glass, a liquid or a gas containing the impurity atoms as a diffusion source is brought into contact with the substrate surface in a quartz diffusion furnace to diffuse the impurity atoms into the surface region of the substrate. A glass layer containing the impurity atoms is formed on the substrate surface. The impurity atoms diffuse into the interior of the substrate from the glass layer by solid phase diffusion. According to a second aspect of the first procedure disclosed in Applied Physics Letter, Vol. 56, No. 14, pp 1334–1335, impurity atoms are adsorbed onto the surface of a semiconductor substrate to form an impurity layer, and the impurity atoms are diffused into the interior of the substrate from the impurity layer on the substrate surface.

The second procedure of the predeposition step is an ion implantation method which comprises accelerating ions of impurity elements and implanting the accelerated ions in the thin oxide-covered, or bare surface region of a substrate, followed by annealing to activate the impurity elements.

The first procedure of the predeposition step has the following problems.

(1) Diffusion is carried out by making the surface of a semiconductor substrate bare. During the diffusion process, an unwanted natural oxide is often formed to a thickness of about 5 Å on the surface of the semiconductor substrate. That is, diffusion of impurity atoms is carried out through the natural oxide. Since the natural oxide is inevitably formed, a large fluctuation occurs in the inner-wafer distribution or the inter-wafer distribution. Thus, there are such problems as large fluctuation in the depth of the diffusion layer and the concentration of impurity atoms diffused through the natural oxide. Furthermore, there is still such a problem as a necessity for a higher temperature for the diffusion of impurity atoms through the natural oxide.

(2) Impurity atoms undergo solid phase diffusion from the glass layer formed on the surface of the semiconductor substrate according to the first aspect of the first procedure. For example, even if a gas is used as a diffusion source, a glass layer is formed on the surface of the semiconductor substrate. Thus, the diffusion source gas is separated from the diffusion layer by the glass layer. Thus, the sensitivity of concentration and flow rate of the diffusion source gas to the diffusion layer is low. Even if the concentration of impurity in the diffusion source gas and flow rate of the diffusion source gas are controlled with higher accuracy, it is difficult to control the concentration of impurity atoms in the diffusion layer with higher accuracy. Since a glass layer containing impurity atoms is formed on the surface of the semiconductor substrate, the subsequent process will be complicated.

(3) The concentration of impurity atoms on the substrate surface usually depends on the solid solubility of impurity atoms in the substrate and the solid solubility depends on a substrate temperature. Within the ordinary applicable temperature range, the higher the substrate temperature, the higher the solid solubility. In order to activate impurity atoms, it is necessary to make the substrate temperature higher than some level. That is, the concentration of impurity atoms in the diffusion layer is made higher than some level, and diffusion at a low concentration of impurity atoms cannot be obtained.

(4) Diffusion coefficient of impurity atoms is so high due to the high substrate temperature that the diffusion depth of impurity atoms is increased. In order to obtain a very shallow junction, it is necessary to make the diffusion time much shorter. Thus, there is such a problem that no sufficiently shallow junction can be obtained with high accuracy.

(5) According to the second aspect of the first procedure, disclosed in Applied Physics Letters, Vol. 56, No. 14, pp 1334–1335, a gas containing impurity atoms is passed in vacuum. Thus, it is difficult to uniformly distribute the gas over the surface of a semiconductor substrate and since the surface concentration of impurity atoms in the diffusion layer depends on the solid solubility of impurity atoms, it is difficult to control the surface concentration of impurity atoms with high accuracy by adjusting the flow rate of the gas containing impurity atoms.

The ion implantation method according to the second procedure has such a problem as the so called channeling, which is such a phenomenon that, when the direction of ion implantation is aligned to a specific orientation of crystal axis, ions can be driven even to a large depth of, for example, a few hundred nonameters in the semiconductor substrate without any difficulty. Thus, a tailing occurs in the impurity distribution profile of the diffusion layer. That is, there is such problem that no sufficiently shallow diffusion layer is obtained and consequently fluctuations are large in the diffusion depth in the shallow diffusion layer.

SUMMARY OF THE INVENTION

An object of the present invention is to solve the foregoing problems and provide an impurity diffusion method for making a diffusion layer with less fluctuations in the inner-wafer distribution or interwafer distribution and an apparatus for carrying out the impurity diffusion method.

Another object of the present invention is to provide an impurity diffusion method for making a much shallower diffusion layer than the conventional diffusion layer and an apparatus for carrying out the impurity diffusion method.

Other object of the present invention is to provide an impurity diffusion method for making a diffusion layer at a lower concentration of impurity atoms than at the conventional atomic concentration and an apparatus for carrying out the impurity diffusion method.

Further object of the present invention is to provide an impurity diffusion method for making a diffusion layer capable of controlling characteristics by adjusting the flow rate and concentration of impurity of a gas containing impurity atoms and an apparatus for carrying out the impurity diffusion method.

The present invention provides an impurity diffusion method which comprises removing natural oxide from a substrate surface with a deoxidizing atmosphere gas, i.e. a gas having a function to convert $SiO_2$ to $SiO$, such as a hydrogen gas as an atmosphere gas for impurity diffusion and then making diffusion of impurity atoms onto the substrate surface, and an impurity diffusion apparatus for carrying out the impurity diffusion method.

In order to improve the controllability of impurity atoms, diffusion is carried out in an oxygen-free atmosphere by rapid heating and rapid cooling after removal of natural oxide from the substrate surface. By making the diffusion in a hydrogen atmosphere under the atmospheric pressure at that time, a diffusion source gas can be uniformly distributed over the substrate surface to reduce fluctuations in the concentration of impurity atoms in the substrate, and direct diffusion from the gas can be attained without any adsorption of an impurity layer on the substrate surface (wafer surface) since the diffusion source gas has a low partial pressure.

Since the diffusion is carried out after the removal of natural oxide, a better diffusion controllability can be obtained than the conventional one. For example, by conducting the diffusion in a hydrogen atmosphere under the atmospheric pressure, an impurity gas as a diffusion source gas can be uniformly distributed over the substrate surface to reduce fluctuation in the concentration of impurity atoms in the substrate. Furthermore, since the partial pressure of the diffusion source gas is low, an impurity layer is never adsorbed on the substrate surface. Thus, impurity atoms can be diffused onto the clean substrate surface directly from the gas phase. That is, the concentration of impurity atoms in the diffusion layer can be controlled by adjusting the flow rate and concentration of impurity of the impurity gas as a diffusion gas source.

Furthermore, since the diffusion can be carried out without any passage through the natural oxide, impurity atoms can be diffused at a lower substrate temperature than the conventional one or for a shorter time by rapid heating and rapid cooling. Thus, a loose distribution of impurity atoms can be prevented, and a shallow junction can be formed. A diffusion layer at a lower concentration of impurity atoms than the conventional level can be also formed.

In Figures, numeral 1 stands for a stainless steel chamber, 2 for a wafer, 3 for a quartz window, 4 for an infrared lamp, 5 for a gas nozzle, 6 for a mass flow controller for a carrier gas, 7 for a mass flow controller for a diffusion source gas, 8 for a mass flow controller for $SiH_4$, 9 for a susceptor, 10 for a work coil, 11 for a cleaning room, 12 for a diffusion room, 13 for a gate valve, 14 for a carrier jig, 15 for a turbo pump, 16 for a dry pump, 17 for an electrode, 18 for a radio frequency power source, 19 for a base electrode, 20 for an emitter electrode, 21 for an emitter polycrystalline silicon, 22 for a silicon nitride film, 23 for a silicon dioxide film, 24 for an extrinsic-base polycrystalline silicon, 25 for a graft base region, 26 for an emitter region, 27 for an intrinsic base region, 28 for an epitaxial layer, 29 for N-type embedded region, 30 for a P-type substrate, 31 for a load lock room, 32 for a carrier room, 33 for a diffusion room-1 and 34 for a diffusion room-2.

DESCRIPTION OF THE PREFERRED EMBODIMENTS

The present invention will be explained in detail below, referring to examples and drawings.

Figure 1:
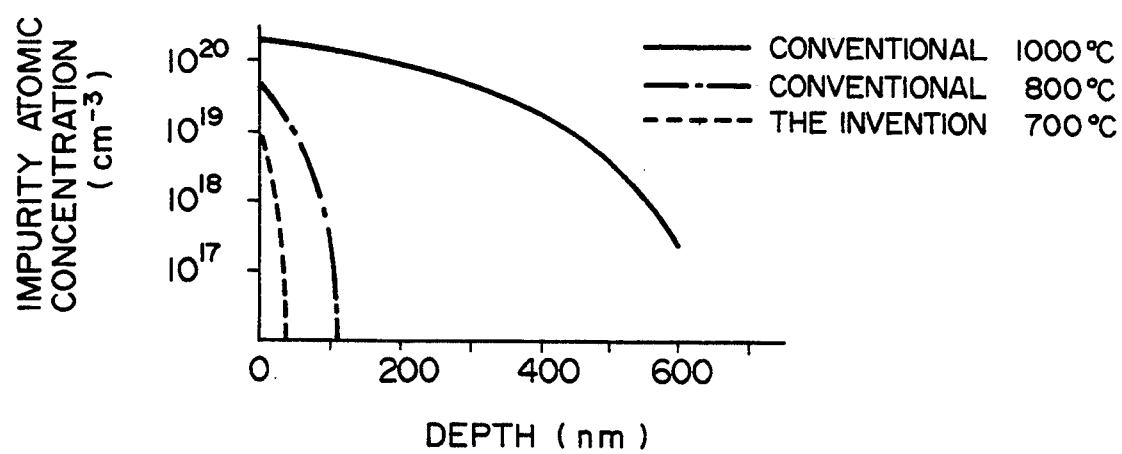
FIG. 1 shows results of determination of impurity distribution of a diffusion layer formed according to the present invention.

FIG. 1 shows results of determination of a diffusion profile in the practice of the present invention with a $B_2H_6$ gas. In the conventional BN diffusion method, uniform diffusion is not obtained at 700° C., whereas in the present invention a junction having a depth of 30 nm can be formed at 700° C.

Figure 2A:
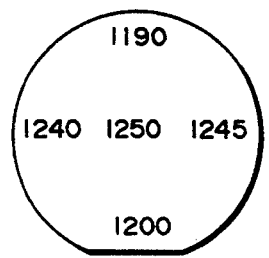
FIGS. 2a and 2b show results of measurement of sheet resistance of a diffusion layer formed according to the present invention.
Figure 2B:
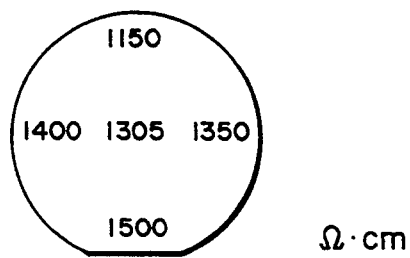

FIG. 2 shows inner-wafer distributions of sheet resistance of a sample diffused with boron at 700° C. from a $B_2H_6$ gas according to the present invention (a) and a sample diffused with boron from BN through a natural oxide according to the conventional method (b), where the distribution of sheet resistance is about 30% in the conventional method, whereas in the present invention it is within 5%.

Figure 3:
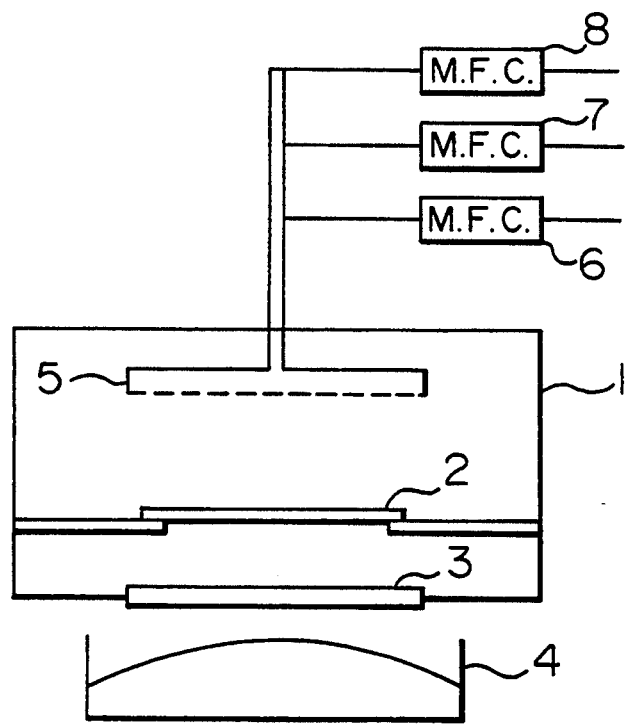
FIG. 3 shows an apparatus for making a semiconductor according to one embodiment of the present invention.

FIG. 3 shows an apparatus for making a semiconductor according to one embodiment of the present invention. A wafer 2 is provided in a stainless steel chamber 1 and $H_2$ is led to the chamber at a flow rate of 10 l/min through a mass flow controller 6. Then, the wafer 2 is irradiated with an infrared lamp 4 through a quartz window 3 to heat the wafer 2 up to 1,000° C. The time required for the temperature elevation is 10 seconds. The wafer 2 is heated at 1,000° C. for 2 seconds to remove natural oxide therefrom and cooled down to 700° C. for 3 seconds. Then, a $B_2H_6$ gas (diluted with $H_2$ to 0.5 vol. % $H_2$) is led to the chamber 1 at a flow rate of 100 cc/min. through a mass flow controller 7 for a diffusion time of 5 minutes. Since diffusion is carried out in a hydrogen atmosphere, diffusion of boron atoms is accelerated to form a shallow diffusion layer having a surface boron atomic concentration of $10^{19}/cm^3$ and a depth of 10 nm. Then, a $B_2H_6$ gas is passed therethrough at the same flow rate as above only for one minute, and $H_2$ annealing is successively carried out for 3 minutes to reduce the surface boron atomic concentration down to $3 \times 10^{18}/cm^3$.

Figure 4:
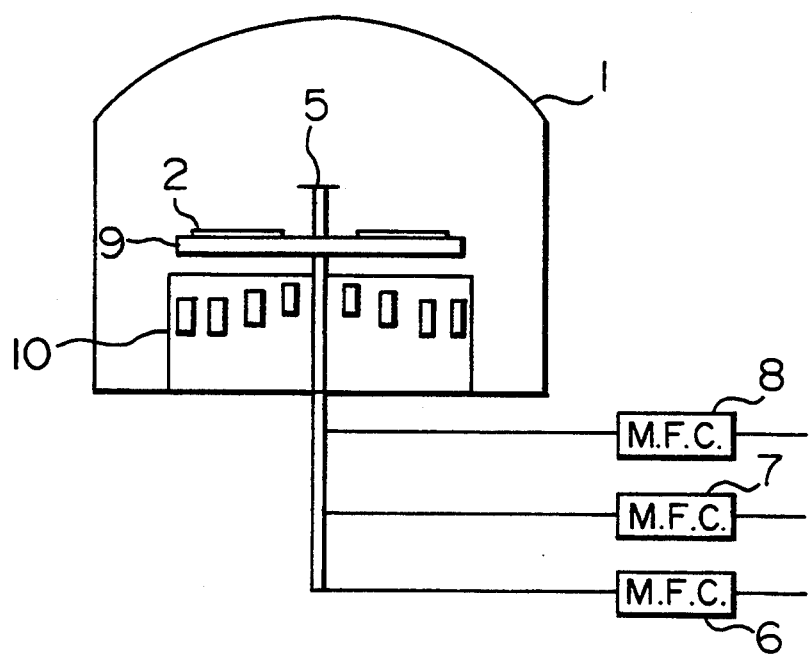
FIG. 4 shows an apparatus for making a semiconductor according to another embodiment of the present invention.

FIG. 4 shows an apparatus for making a semiconductor according to another embodiment of the present invention, which is similar to an ordinary apparatus for epitaxtial growth under the atmospheric pressure, using a quartz bell jar chamber 1. Wafer 2 is provided in the chamber 1 and a $N_2$ gas is led to the chamber 1 at a flow rate of 50 l/min from a gas nozzle 5 for 10 minutes and then $H_2$ is led to chamber 1 at a flow rate of 50 l/min. for 10 minutes to replace the $N_2$ gas in the chamber 1. While passing $H_2$ thereto, a power is applied to a work coil 10 to heat a susceptor 9 and the wafer 2 at a temperature elevation rate of 70° C. /min. Natural oxide is completely removed from the wafer 2 by annealing at 1,050° C. for 10 minutes. By adding a $SiH_4$ gas (diluted with $H_2$ to 4% vol. $H_2$) at a flow rate of 20 cc/min. thereto through a mass flow controller 8, etching of $SiC_2$ is accelerated, and thus the natural oxide can be removed at 800° C.

Then, while passing $H_2$ to the chamber 1, a $B_2H_6$ gas (diluted with $H_2$ to 0.5 vol. % $H_2$) is passed thereto at a flow rate of 250 cc/min. at 800° C. for 30 minutes to form a P-type diffusion layer. The B surface atomic concentration of the boron diffusion layer is $8 \times 10^{19}/cm^3$ and the diffusion depth is 80 µm. At that time, $BF_3$ and $BCl_3$ can be used as diffusion source gases. When $PH_3$, $A_sH_3$ and $SbH_3$ are used as diffusion source gases, an N-type diffusion layer can be formed. After the end of diffusion, the power applied to the work coil 10 is reduced to decrease the temperature of wafer 2 at a rate of 100° C./min. When the temperature is decreased to lower than 400° C., the gas in the chamber 1 is replaced with a $N_2$gas, and the wafer 2 is taken out of the chamber 1, after the wafer temperature reaches room temperature. By passing a diffusion source gas and a $SiH_4$ gas at the same time during the diffusion of impurity atoms in the present apparatus, doping can be obtained on clean Si free from the natural oxide.

It is also possible to deposit a Si layer to a thickness of about 5 nm at first and then diffuse impurity atoms into the Si layer.

Figure 5:
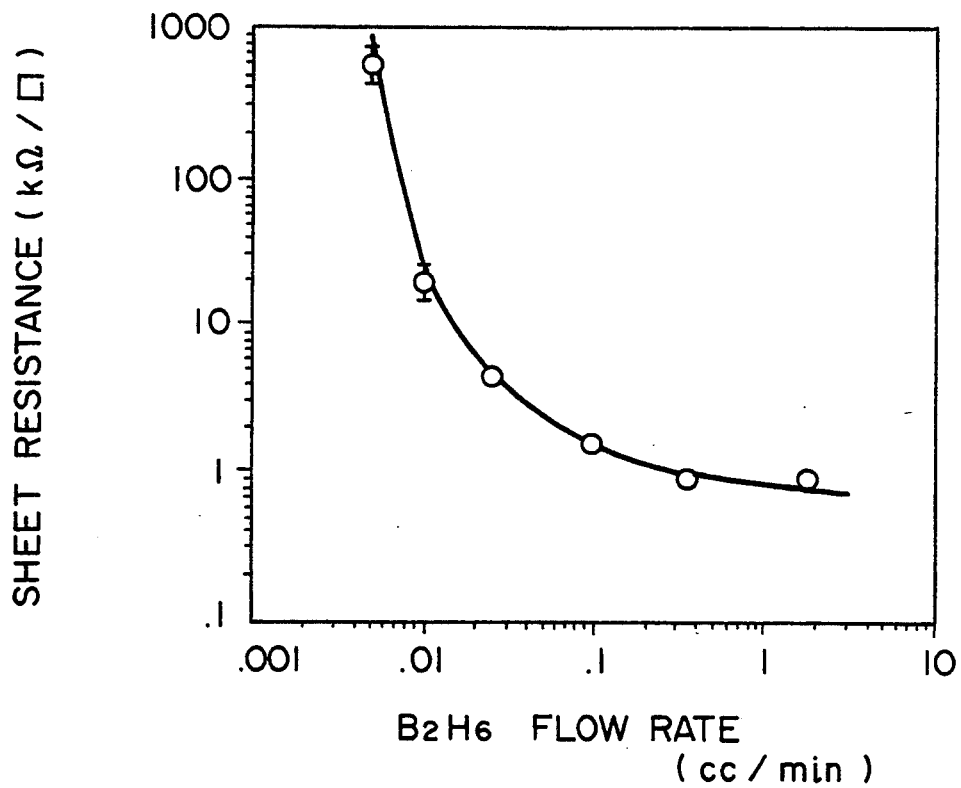
FIG. 5 is a diagram showing dependency of sheet resistance of a diffusion layer formed according to the present invention on a gas flow rate.

FIG. 5 shows results of measurements of sheet resistance when a diffusion layer is formed in an apparatus of FIG. 4 by changing the flow rate of $B_2H_6$ gas at a diffusion temperature of 800° C. for a diffusion time of 30 minutes. $B_2H_6$ gas is a gas diluted with $H_2$ to 0.1 vol. % $H_2$. Sheet resistance can be controlled in a range of 800Ω to 600 kΩ. Neither boron layer nor an alloy layer of silicon and boron is formed on the semiconductor single crystal surface and direct diffusion from the gas phase can be obtained. Impurity is thoroughly activated after the diffusion without annealing.

Figure 6:
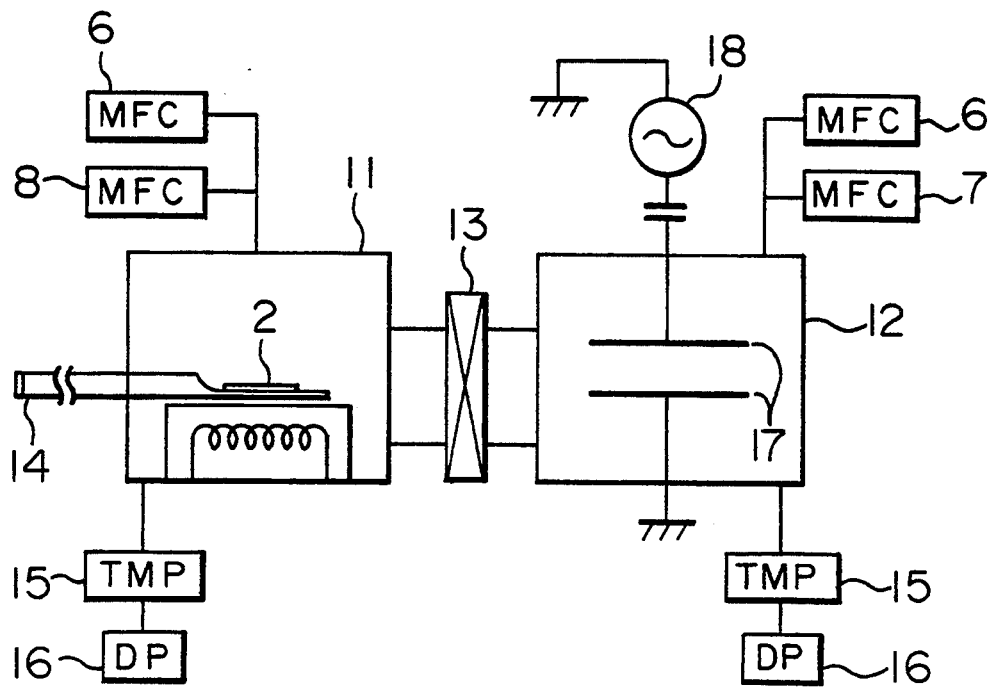
FIG. 6 shows an apparatus for making a semiconductor according to further embodiment of the present invention.

FIG. 6 shows an apparatus for making a semiconductor according to further embodiment of the present invention. Wafer 2 is provided in a cleaning room 11 and kept at 1,000° C. under the atmospheric pressure or reduced pressure of about 100 Torr for 10 minutes, while passing a $H_2$ gas to the cleaning room 11 at a flow rate of 50 l/min. through a mass flow controller 6 to remove natural oxide from the wafer surface. By passing a $S_iH_4$ gas thereto at a flow rate of 10 cc/min. through a mass flow controller 8 and conducting annealing at 800° C., the natural oxide can be also removed. Then, the cleaning room 11 is evacuated by a turbo molecular pump 15 and a dry pump 16, while decreasing the temperature. At the same time, a diffusion room 12 is likewise evacuated. When the cleaning room 11 and the diffusion room 12 reach a vacuum degree of $1 \times 10^{-9}$ Torr, a gate valve 13 is opened, and the wafer 2 is moved to the diffusion room 12 by a carrier jig 14. Then, a $H_2$ gas and a $B_2H_6$ gas are passed to the diffusion room 12 through mass flow controllers 6 and 7, respectively, and their flow rates are so set as to make the pressure 3 Torr, and radio frequency power is applied to electrodes 17 to generate plasma. By conducting doping under these conditions a diffusion layer having a depth of 20 nm can be formed.

Figure 7:
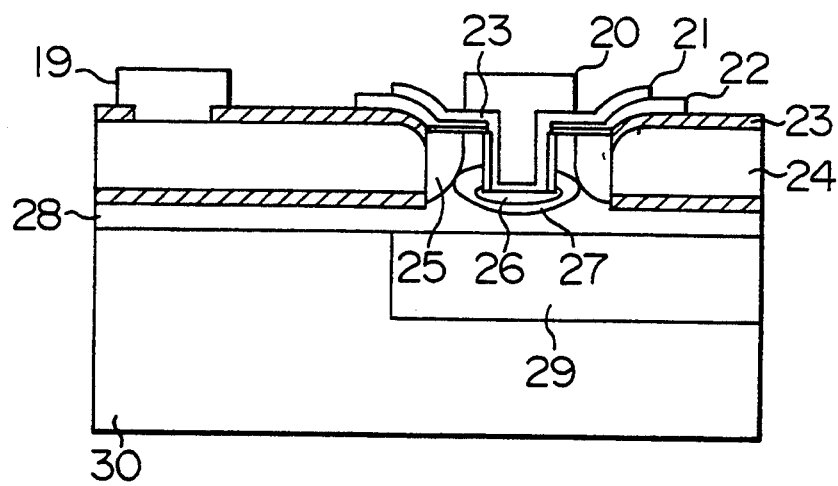
FIG. 7 shows a semiconductor device according to one embodiment of the present invention.

FIG. 7 is a cross-sectional view of a bipolar transistor having a base region and an emitter region formed according to the present invention. An epitaxial growth layer 28 is deposited to a thickness of 500 nm on an N-type buried layer 29 and regions, which will be an emitter region and a base region, are left by photolithography. After an extrinsic-base polycrystalline layer 24 and a graft base region 25 are formed, a groove is provided to a depth of 200 nm in the single crystal region with a silicon nitride film 22 as a mask. After a silicon dioxide film is formed on the side wall of the groove, annealing is carried out in a $B_2H_6$ gas atmosphere at 700° C. for 30 minutes to form an intrinsic base region 27 having a depth of 30 nm. Furthermore, the gas is changed to $PH_3$ in the same chamber as above, and annealing is carried out at 700° C. for 5 minutes to form an emitter region 26. According to this procedure, a spherical impurity profile can be obtained.

Figure 8:
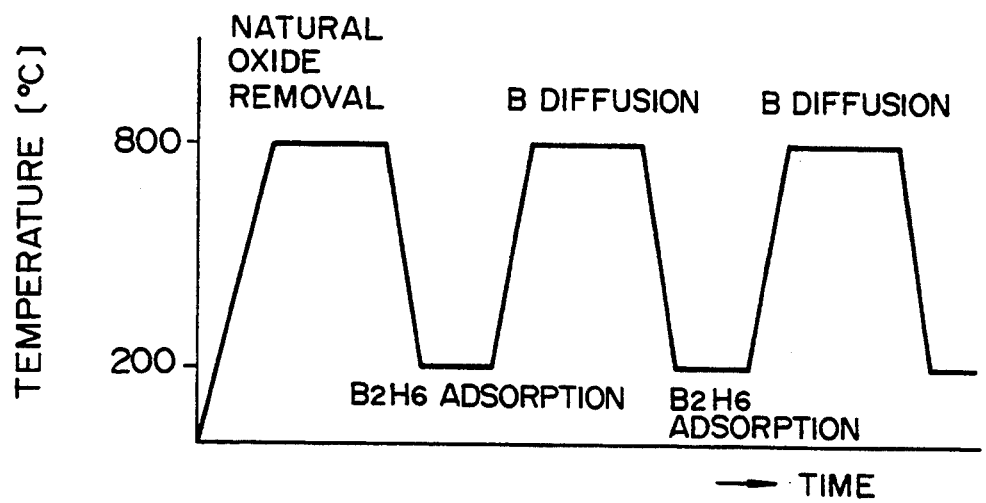
FIG. 8 is a temperature sequence diagram in the practice of the present invention.
Figure 9:
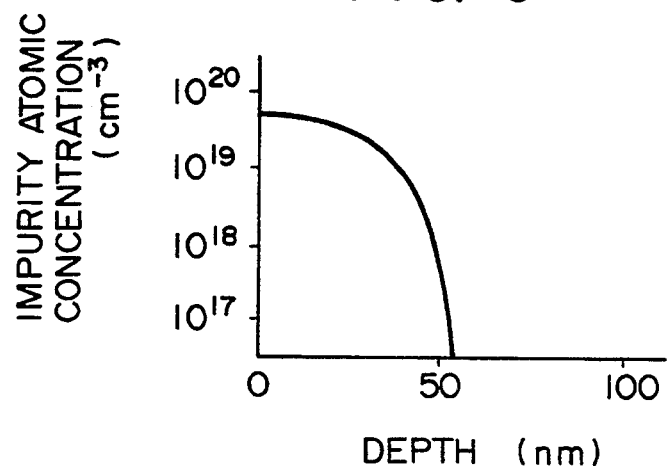
FIG. 9 shows results of determination of impurity distribution of a diffusion layer formed according to the present invention.

FIGS. 8 and 9 show other embodiments of the present invention. As shown in FIG. 8, annealing is conducted in a hydrogen atmosphere in an apparatus shown in FIG. 3 to remove natural oxide, and then the temperature is lowered to 200° C., and a $B_2H_6$ gas (diluted with $H_2$ to 0.5 vol. % $H_2$) is passed thereto to make the silicon surface adsorb boron atoms. Then, the temperature is elevated again to 800° C. by lamp heating to conduct annealing for 5 minutes, thereby diffusing the boron atoms. By 30 repetitions of this process, a diffusion layer having a depth of about 50 nm, as shown in FIG. 9, can be formed. By 10 repetitions of the process, the diffusion depth amounts to 15 nm.

Figure 10:
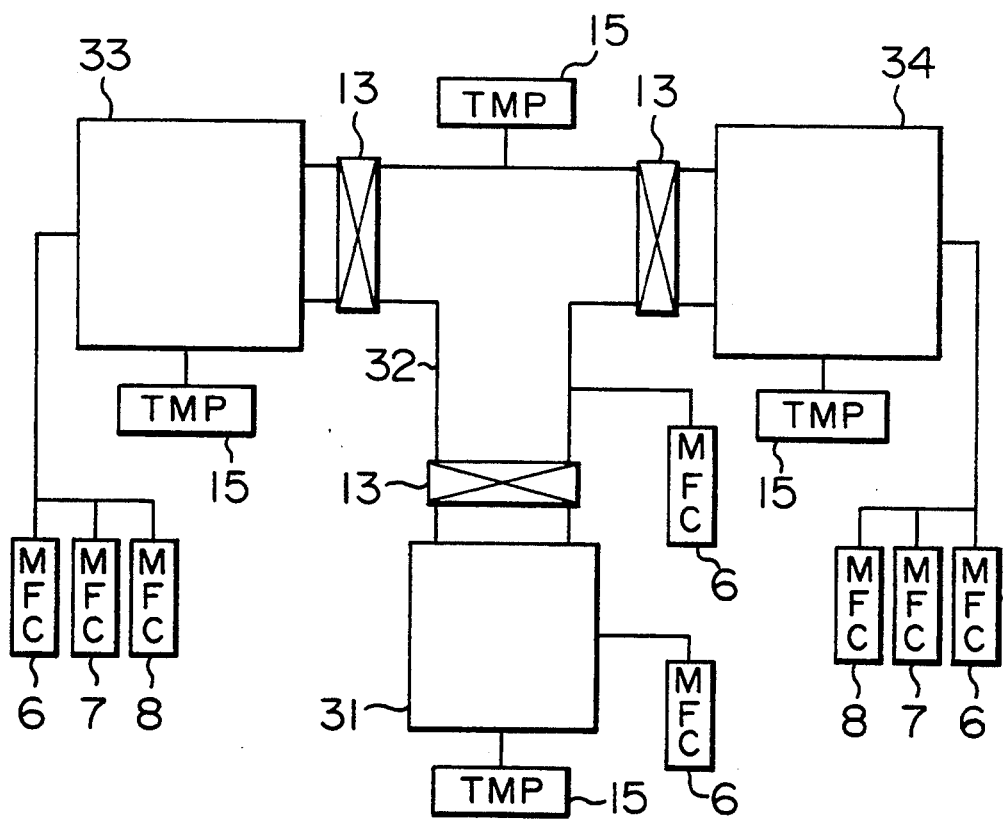
FIG. 10 shows an apparatus for making a semiconductor according to still further embodiment of the present invention.
Figure 11:
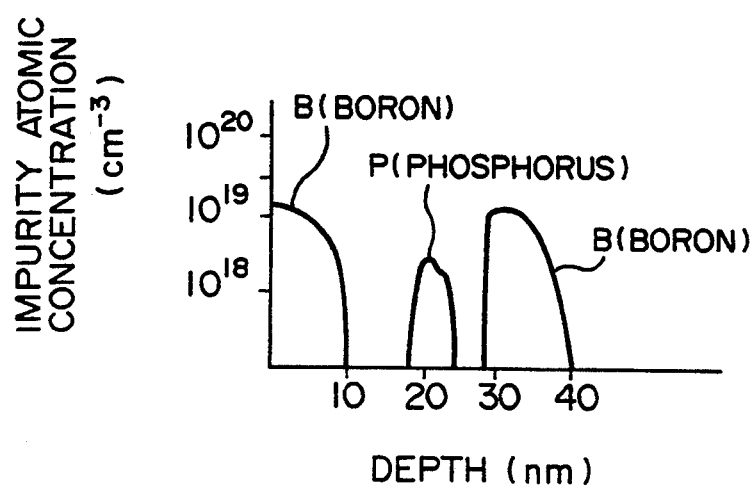
FIG. 11 shows an impurity distribution of an ultra lattice structure formed according to the present invention.

FIG. 10 shows an apparatus for making a semiconductor according to still further embodiment of the present invention, which comprises a load lock room 31 and diffusion rooms 31, communicated with one another through a carrier room 32. A wafer is provided in the load lock room 31 and then a $N_2$ gas is passed thereto at a flow rate of 20 l/min for 10 minutes through a mass flow controller 6. Then, the gas is changed to $H_2$, which is passed thereto for 10 minutes. At the same time, $H_2$ is also passed to the carrier room 32 and the diffusion rooms 33 and 34 each at a flow rate of 20 l/min. to make purging. Then, gate valves 13 are opened to transfer the wafer to the diffusion room 33. While keeping $H_2$ to pass thereto at a flow rate of 20 l/min., the wafer is heated to 800° C. by lamp heating. Then, a $B_2H_6$ gas (diluted with with $H_2$ to 0.1 vol. % $H_2$) is passed thereto at a flow rate of 100 cc/min. for 5 minutes through a mass flow controller 7 to form a P-type diffusion layer having a diffusion depth of 10 nm. Then, a $S_iH_4$ gas (diluted with $H_2$ to 4 vol. % $H_2$) is passed thereto at a flow rate of 2 l/min for one minute through a mass flow controller 8 to make an epitaxial layer having a depth of 10 nm grow. Then, while passing a $H_2$ gas thereto, the temperature is lowered to 200° C., and the gate valves 13 is opened to transfer the wafer from the diffusion room 33 to the other diffusion room 34 in a $H_2$ atmosphere. Then, the wafer is heated again, and a $PH_3$ gas (diluted with $H_2$ to 0.1 vol. % $H_2$) is passed thereto at a flow rate of 120 cc/min. for 3 minutes. Then, a $S_iH_4$ gas (diluted with $H_2$ to 4 vol. % $H_2$) is passed thereto at a flow rate of 2 l/min. for one minute to form an N-type diffusion layer and an epitaxial growth layer. In the similar manner, the wafer is returned to the diffusion room 33, and a $B_2H_6$ gas (diluted with $H_2$ to 0.1 vol. % $H_2$) is passed thereto to form a P-type diffusion layer. An ultra lattice of PNP three-layer structure can be formed thereby. By repeating this process, a multilayer structure can be also formed. Impurity distribution of the ultra lattice formed according to this method is shown in FIG. 11.

Figure 12:
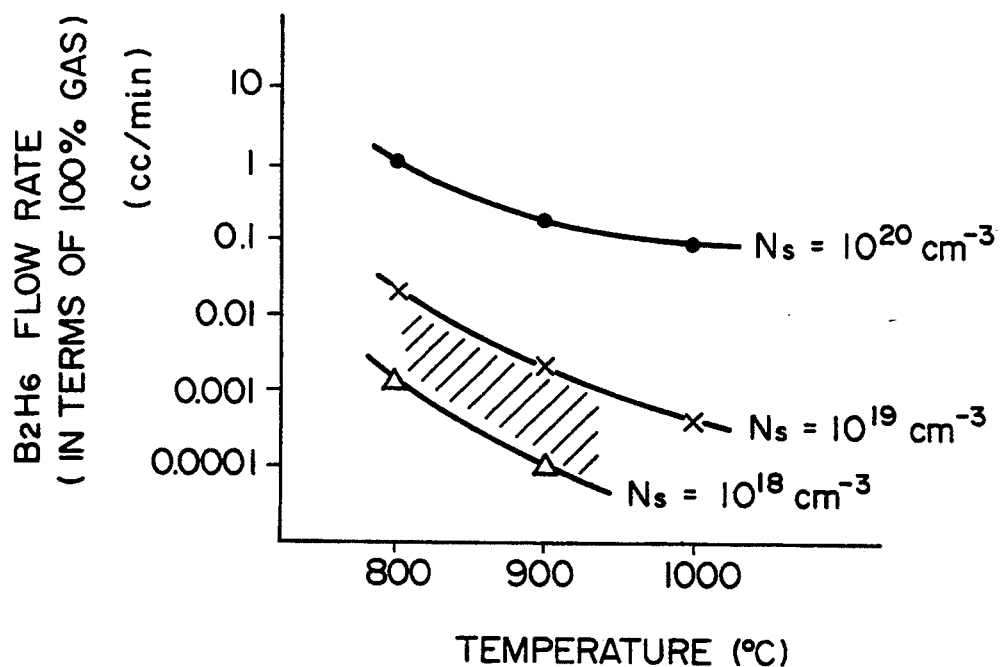
FIG. 12 is a diagram showing surface impurity atomic concentrations in diffusion layers formed according to the present invention.

FIG. 12 is a, diagram showing a relationship between the surface impurity atomic concentration of diffusion layers formed by the apparatus shown in FIG. 3, the diffusion temperature and the $B_2H_6$ gas flow rate for a diffusion time of 30 minutes, where the hatched region is a region of the surface impurity atomic concentration ranging from $10^{18}/cm^3$ to $10^{19}/cm^3$. A cutoff frequency of 50 GHz can be obtained by forming a base region of a bipolar transistor under these conditions.

Figure 13:
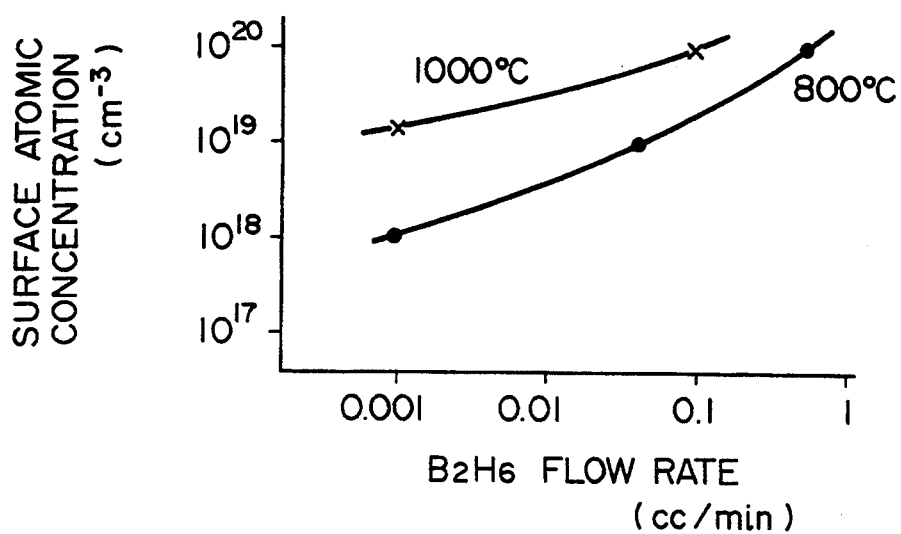
FIG. 13 is a diagram showing a relationship between the surface impurity atomic concentration in diffusion layers formed according to the present invention and the gas flow rate.

FIG. 13 is a diagram showing a relationship between the surface impurity atomic concentration of similar diffusion layer and the $B_2H_6$ gas flow rate, where the surface impurity atomic concentration can be controlled in a range of $10^{18}/cm^3$ to $10^{20}/cm^2$ at a diffusion temperature of 800° C.

Figure 14B:
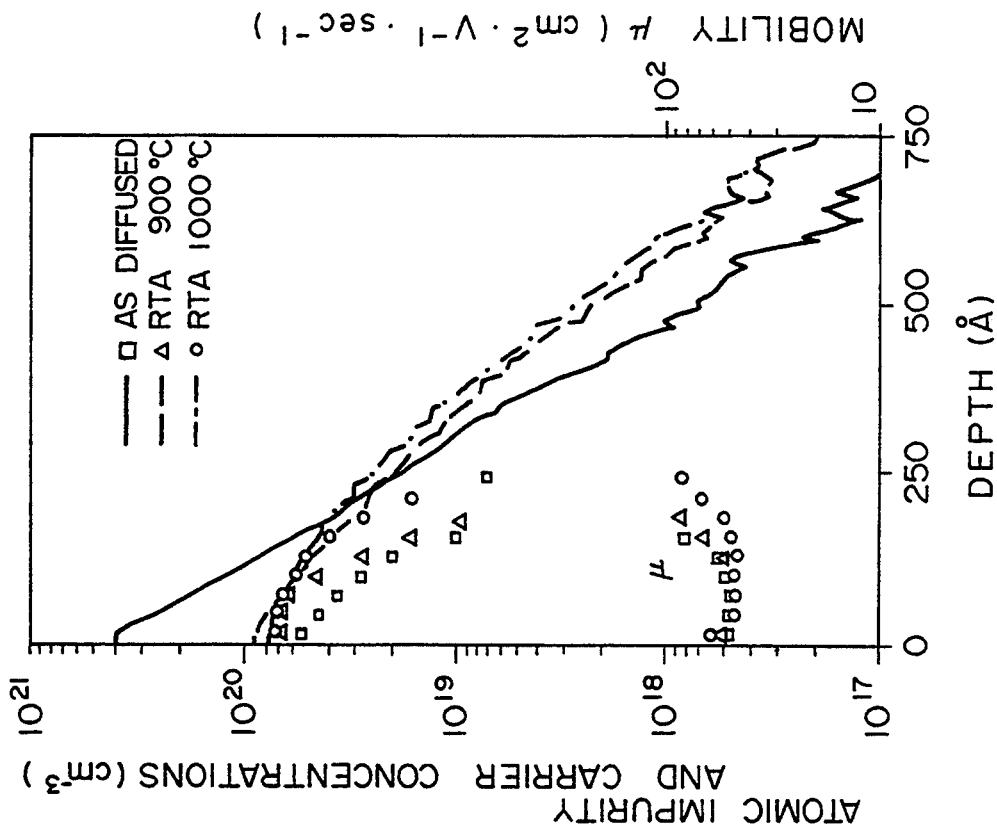
FIG. 14 is diagrams showing distributions of impurity and carrier in diffusion layers formed according to the present invention.
Figure 14A:
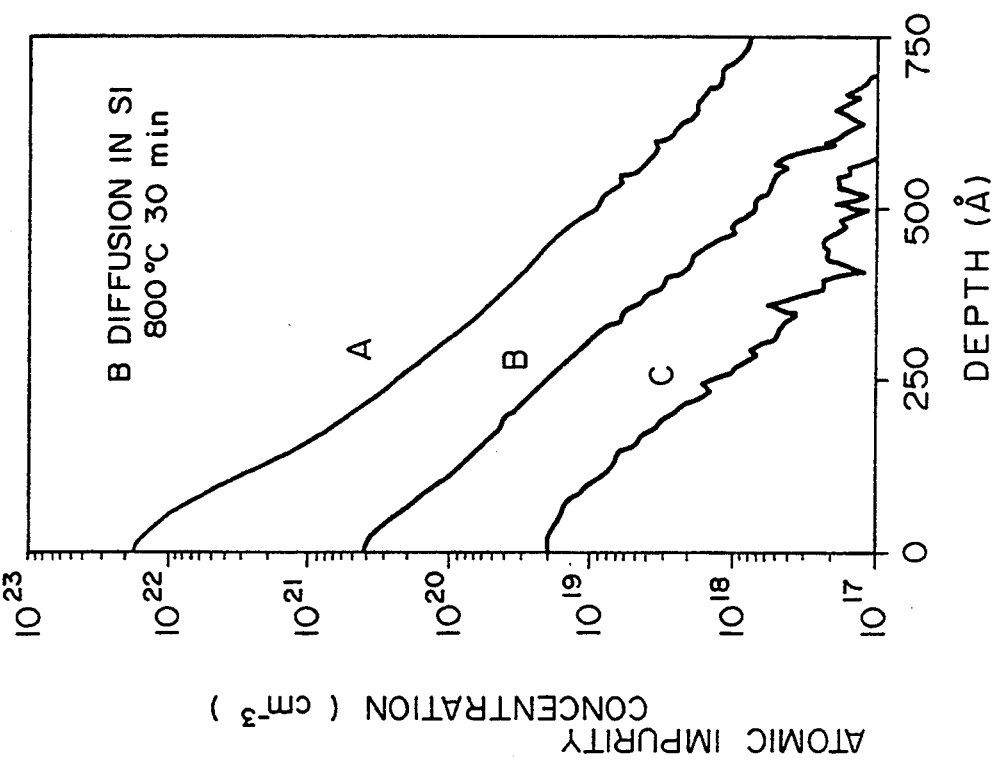

Left diagram of FIG. 14 shows the impurity atomic concentration distribution of impurity diffusion layers formed according to the present invention, and right diagram of FIG. 14 shows the impurity atomic concentration distribution, carrier atomic concentration distribution and carrier mobility distribution of the diffusion layer shown by B in the left diagram after rapid heating. By rapid heating, the percent carrier activation reaches substantially 100%. A diode formed by depositing N-type polycrystalline silicon on the diffusion layer has a reverse leak current density of $10^{-10}$ A/cm$^2$ and thus shows good electrical characteristics.

According to the present invention, impurity atoms can diffuse without any passage through the natural oxide and thus a shallow junction, which is impossible to obtain by the ion implantation method, can be formed at a low temperature. Since a diffusion source is used in a gas form, the impurity concentration of the diffusion layer can be controlled by adjusting the concentration and flow rate of the gas. In case of rapid heating and rapid cooling, a sharp impurity profile can be formed. In case of using the hydrogen atmosphere under the atmospheric pressure, adsorption of impurity atoms onto the semiconductor single crystal substrate can be accelerated. Furthermore, a diffusion source gas can be uniformly distributed over the substrate. Since neither an impurity-containing glass layer nor an impurity layer is formed on the single crystal surface, the surface atomic concentration in the diffusion layer can be changed in a wide range from a low concentration up to a high concentration.

What is claimed is:

1. An impurity diffusion method for forming a diffusion layer by diffusing an impurity of a first conductivity type into a semiconductor material, which comprises removing natural oxides from the surface of the semiconductor material with an atmosphere gas containing a deoxidizing gas, then passing an impurity gas comprising a compound containing the impurity and hydrogen to the surface of the semiconductor material while passing the atmosphere gas thereto, thereby diffusing the impurity into the surface of the semiconductor material directly from a gas phase where a flow rate or concentration of impurity of the impurity gas is set, so that the impurity atomic concentration of the diffusion layer is controlled by the flow rate or the concentration of impurity of the impurity gas.

2. An impurity diffusion method according to claim 1, wherein the deoxidizing gas is a gas having a function to convert $S_iO_2$ to $S_iO$.

3. An impurity diffusion method according to claim 1, wherein the deoxidizing gas is hydrogen gas.

4. An impurity diffusion method according to claim 1, wherein the surface atomic concentration of the diffusion layer is lower than the solid solubility of the impurity into the semiconductor material.

5. An impurity diffusion method according to claim 1, wherein the impurity is made to diffuse by heating after the natural oxide is removed from the surface of the semiconductor material.

6. An impurity diffusion method according to claim 1, wherein diffusion of the impurity and activation of the diffused impurity are carried out simultaneously, while passing the impurity gas to the surface of the semiconductor material.

7. An impurity diffusion method according to claim 1, wherein the impurity is directly diffused from the gas phase onto the surface of the semiconductor material without forming a shallow diffusion layer of the impurity on the surface of the semiconductor material in advance.

8. An impurity diffusion method according to claim 1, wherein the impurity diffusion is directed to formation of base region or emitter region of a bipolar transistor.

9. An impurity diffusion method according to claim 1, wherein the impurity gas is $B_2H_6$ or $PH_3$.

10. An impurity diffusion method according to claim 1, wherein a flow rate ratio of the impurity gas to the deoxidizing gas is not more than $1 \times 10^{-4}$.

11. An impurity diffusion method according to claim 1, wherein said semiconductor material is a semiconductor single crystal substrate.

12. An impurity diffusion method according to claim 1, wherein said semiconductor material is a silicon layer formed on a semiconductor substrate.

13. An impurity diffusion method according to claim 1, wherein said semiconductor material is an epitaxial layer formed on a semiconductor substrate.

14. An impurity diffusion method according to claim 1, wherein the impurity gas is a gas comprising a compound of a Group III or Group V impurity element and hydrogen.

15. An impurity diffusion method according to claim 1, wherein the impurity gas comprises a compound containing an impurity element selected from the group consisting of boron, phosphorus, arsenic and antimony and hydrogen.

16. An impurity diffusion method according to claim 1, wherein the impurity gas comprises a compound selected from the group consisting of $B_2H_6$, $PH_3$, $AsH_3$, and $SbH_3$.

* * * * *